United States Patent [19]

Shimizu

[11] Patent Number: 4,967,248
[45] Date of Patent: Oct. 30, 1990

[54] STRUCTURE OF SEMICONDUCTOR MEMORY CELL WITH TRENCH-TYPE CAPACITOR

[75] Inventor: Toshiyuki Shimizu, Tokyo, Japan
[73] Assignee: NEC Corporation, Tokyo, Japan
[21] Appl. No.: 181,136
[22] Filed: Apr. 13, 1988
[30] Foreign Application Priority Data
  Apr. 15, 1987 [JP] Japan .................................. 62-93660
[51] Int. Cl.[5] ..................... H01L 29/68; H01L 29/34; H01L 29/06
[52] U.S. Cl. ..................................... 357/23.6; 357/54; 357/55
[58] Field of Search ........................................ 357/23.6
[56] References Cited
FOREIGN PATENT DOCUMENTS
201706 11/1986 European Pat. Off. ........... 357/23.6

Primary Examiner—Rolf Hille
Assistant Examiner—Robert P. Limanek
Attorney, Agent, or Firm—Sughrue, Mion, Zinn, Macpeak & Seas

[57] ABSTRACT

For increasing a retaining time period of a data bit, there is disclosed a semiconductor memory cell comprising a switching transistor and a storage capacitor fabricated in a semiconductor substrate formed with a heavily doped layer and a lightly doped layer, a transition layer graded in impurity atom concentration is produced between the heavily doped layer and the lightly doped layer, and the storage capacitor comprises (a) a first electrode formed by a first side wall portion of the lightly doped layer, a second side wall portion of the heavily doped layer and a bottom wall portion of the heavily doped layer, (b) a dielectric film formed in the first and second side wall portions and the bottom wall portion and defining a trench and (c) a second electrode formed on the trench and contacting the dielectric film, wherein the dielectric film has a relatively thin portion and a relatively thick portion which covers the transition layer so as to reduce in strength of electric field around the transition layer.

10 Claims, 8 Drawing Sheets

PRIOR-ART

STRUCTURE OF SEMICONDUCTOR MEMORY CELL WITH TRENCH-TYPE CAPACITOR

FIELD OF THE INVENTION

This invention relates to a semiconductor memory cell and, more particularly, to the structure of a capacitor incorporated in a dynamic random access memory cell.

BACKGROUND OF THE INVENTION

Since the beginning of the integrated circuit era, the minimum device dimension has been shrunk at a high annual rate to fabricate much more component transistors on a single semiconductor substrate. This tendency is eminent in the semiconductor memory field, and some manufacturers produce dynamic type random access memory devices each having a large number of memory cells of, for example, more than 1 mega-bits. In those dynamic type random access memory devices, each memory cell is usually formed by a single capacitor associated with a single switching transistor, and this one-transistor and one-capacitor configuration seems to become the majority of the memory cell structure.

One of the technical subjects for fabrication of a dynamic type random access memory device with more than 1 mega-bit memory cells is to reduce the occupation area of each memory cell in the real estate of the semiconductor substrate of, typically, single crystal silicon, and a reduction of capacitor's occupation area is effective to increase the integration density because the capacitor largely consumes the occupation area of the memory cell. For this reason, research and development efforts are being made for reduction of the capacitor's occupation area, and one of the results is disclosed in FIG. 1. Namely, the trench-type information storage capacitor disclosed in FIG. 1 is fabricated in a p-type silicon substrate 1 consisting of a heavily doped layer 2 and a lightly doped epitaxial layer 3. The p-type silicon substrate 1 is formed with a cavity defined by wall portion of the silicon substrate 1, and the wall portion is covered with a thin dielectric film 4. Then, a trench is defined by the thin dielectric film 4 and is filled with a conductive material to form a storage electrode 5 which is electrically connected to an heavily doped n-type impurity region 6. The heavily doped n-type impurity region 6 serves as a source/drain region, and the heavily doped n-type impurity region 6 forms part of a MOS type field effect transistor together with a heavily doped n-type impurity region 7 and a word line 8 on a thin oxide film 9. In the prior art information storage capacitor illustrated in FIG. 1, the conductive material in the trench provides the storage electrode 5, so that the heavily doped $p^+$-type layer 2 of the substrate 1 is needed to prevent the capacitor from reduction in capacitance. An isolation region 10 including a thick field insulating layer is provided for preventing an interference between adjacent memory cells. It is reported in SSD, 86-2, pages 9 to 16 that a reduction of capacitance is less than 5 percent upon application of 7 volts between the silicon substrate 1 and the storage electrode 5 across an silicon dioxide of 200 angstroms in converted thickness if the $p^+$-type layer of the substrate 1 is doped with boron atoms ranging between $10^{19}$ cm$^{-3}$ and $10^{20}$ cm$^{-3}$. In this structure, an interference phenomenon hardly takes place between the adjacent memory cells even if the interval is reduced, and it is difficult for electric charges produced in the silicon substrate 1 due to alpha-particles emanating to reach the trench-type capacitor of the memory cell, thereby being prevented from soft errors.

However, a problem is encountered in the prior-art semiconductor memory cell structure in that a storage information bit in the form of electric charges is liable to be lost due to leakage current flowing between the silicon substrate 1 and the heavily doped n-type impurity region 6. In detail, the silicon substrate 1 has a multiple layer structure consisting of the heavily doped layer 2 and the lightly doped epitaxial layer 3, and a strong electric field takes place at the boundary of the layers 2 and 3 in an usual operation. For example, if the silicon dioxide film 4 is selected to be 200 angstroms thick, the strength of the electric field in the direction of write-in voltage is calculated to be $2 \times 10^5$ V/cm under an usual operation voltage of the silicon substrate 1 used in a practical application. Then, an avalanche breakdown or a zener breakdown tends to take place at the boundary between the heavily doped layer 2 and the lightly doped layer 3, and a leakage current flows between the silicon substrate 1 and the n-type impurity region 6. The electric charges representing the storage information bit are liable to participate the leakage current so that the storage information bit is lost within a relatively short time period as reported in "BSE cell used for mega-bit DRAM ", SSD 86-2, pages 9 to 16. This tendency results in unstable storage characteristics due to a fluctuation of substrate voltage or a dynamic noise.

Similar structures are disclosed by M. Sakamoto et al in "BURIED STORAGE ELECTRODE (BSE) CELL FOR MEGABIT DRAM ", IEDM 85, pages 710 to 713, by W. F. Richardson et al. in "A TRENCH TRANSISTOR CROSS-POINT DRAM CELL", IEDM 85, pages 714 to 717, by N. Lu et al in "THE SPT CELL - A NEW SUBSTRATE-PLATE TRENCH CELL FOR DRAMS", pages 771 and 772, by W. P. Noble et al in "PARASITIC LEAKAGE IN DRAM TRENCH STORAGE CAPACITOR VERTICAL GATED DIODES", IEDM 87, pages 340 to 343, and by Sanjay Banerjee et al. in "A BAND-TO-BAND TUNNELING EFFECT IN THE TRENCH TRANSISTOR CELL", 1987 Symp. on VLSI Technology, pages 97 and 98, respectively.

SUMMARY OF THE INVENTION

It is therefore an important object of the present invention to provide a structure of semiconductor memory cell which is free from the problems inherent in the prior-art memory cell structure.

To accomplish these objects, the present invention proposes to increase the thickness of a portion of the dielectric film covering the transition area.

In accordance with the present invention, there is provided a semiconductor memory cell comprising a switching transistor and a storage capacitor fabricated in a semiconductor substrate formed with a heavily doped layer and a lightly doped layer, a transition layer graded in impurity atom concentration being produced between the heavily doped layer and the lightly doped layer, the storage capacitor comprising (a) a first electrode formed by a first side wall portion of the lightly doped layer, a second side wall portion of the heavily doped layer and a bottom wall portion of the heavily doped layer, the first and second side wall portions and the bottom wall portion defining a cavity, (b) a dielectric film formed on the first and second side wall portions and the bottom wall portion and defining a trench, and (c) a second electrode formed in the trench and contacting the dielectric film, wherein the dielectric film has a relatively thin portion and a relatively thick portion which covers the transition layer.

The relatively thin portion may be formed by a first insulative film and the relatively thick portion is formed by the first insulative film and a second insulative film formed on the first insulative film, and the first and second insulative film may be formed of silicon dioxide. In this implementation, the second insulative film may have a thickness ranging between 500 angstroms and 3000 angstroms.

The heavily doped layer may be overlain by the lightly doped layer, and the heavily doped layer has a boron atom concentration ranging between $5 \times 10^{18}$ cm$^{-3}$ and $5 \times 10^{19}$ cm$^{-3}$, but the lightly doped layer has a boron atom concentration ranging between $1 \times 10^{15}$ cm$^{-3}$ and $1 \times 10^{16}$ cm$^{-3}$. Alternatively, the heavily doped layer is formed along the second side wall portion and surrounded by the lightly doped layer.

BRIEF DESCRIPTION OF THE DRAWINGS

The features and advantages of a semiconductor memory cell according to the present invention will be more clearly understood from the following description taken in conjunction with the accompanying drawings in which.

DESCRIPTION OF THE PREFERRED EMBODIMENTS

First Embodiment

Figure 1:
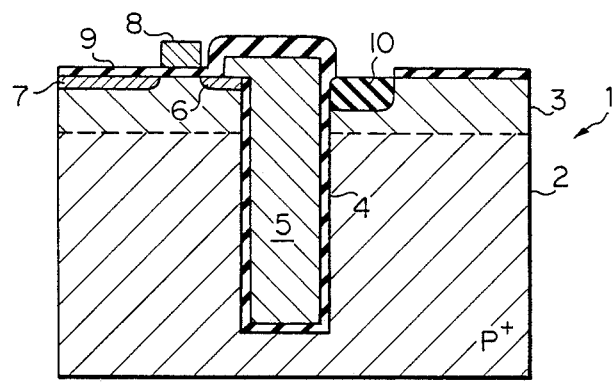
FIG. 1 is a cross sectional view showing the structure of a prior-art semiconductor memory cell.
Figure 2:
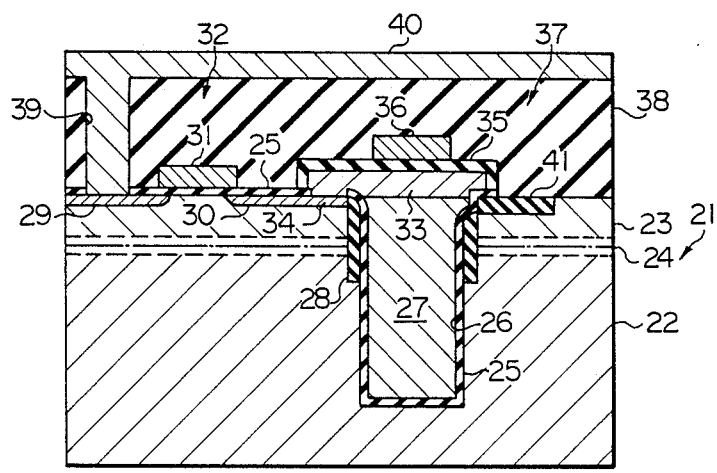
FIG. 2 is a cross sectional view showing the structure of a semiconductor memory cell according to the present invention.

Referring to FIG. 2 of the drawings, there is shown the structure of a dynamic random access memory cell embodying the present invention. The dynamic random access memory cell is fabricated on a p-type single crystal silicon substrate 21, and the silicon substrate 21 comprises a heavily doped layer 22 (silicon body of single crystal ) and a lightly doped epitaxial layer 23. The heavily doped layer 22 is doped with boron atoms ranging between $5 \times 10^{18}$ cm$^{-3}$ and $5 \times 10^{19}$ cm$^{-3}$, and the lightly doped epitaxial layer 23 is doped with boron atoms ranging between $1 \times 10^{15}$ cm$^{-3}$ and $1 \times 10^{16}$ cm$^{-3}$ and has a thickness ranging between 2 microns and 4 microns. The silicon substrate 21 thus formed has a transition area 24 extending form the original upper surface of the heavily doped layer 22 into both of the heavily doped and lightly doped layers 22 and 23. The transition area 24 is graded in boron atom concentration from the heavily doped layer 22 to the lightly doped layer 23. A cavity is formed in the silicon substrate 21 and defined by the bottom wall portion of the heavily doped layer 22, the side wall portion of the heavily doped layer 22 and the side wall portion of the lightly doped layer 23. The bottom wall portion and the side wall portions are covered with a dielectric film 25, so that a trench 26 is defined by the dielectric film 25. The trench 26 is filled with a conductive material such as, for example, polysilicon doped with n-type impurity atoms, and the conductive material serves as a storage electrode 27. Another dielectric film 28 partially covers the outer surface of the dielectric film 25, and the dielectric film 28 extends over the transition area 24. In the surface portion of the lightly doped epitaxial layer 23 is formed a heavily doped n-type source/drain regions 29 and 30 spaced from each other, and a word line 31 is formed on an extension of the dielectric film 25 located over that area between the source/drain regions 29 and 30. The source/drain regions 29 and 30 and the word line 31 as a whole constitutes a MOS type switching transistor 32.

For electrical connection, a bridging member 33 of, for example, polysilicon is formed over the storage electrode 27 and an heavily doped n-type region 34 which is merged into one of the source/drain regions of the switching transistor 32. The bridging member 33 is thermally oxidized to form an insulative film 35, so that the bridging member 33 and, accordingly, the storage electrode 27 are electrically isolated from a wiring layer 36 extending over the bridging member 33. The portion of the silicon substrate 21 contacting the dielectric film 25 or 28 serves as a plate electrode, and the plate electrode, the dielectric films 25 and 28 and the storage electrode 27 as a whole constitute a storage capacitor 37. The switching transistor 32 and the storage capacitor 37 form in combination a dynamic type memory cell, and the dynamic type memory cell is covered with an insulative material such as, for example, silicon dioxide to form a insulating layer 38. The insulating layer 38 is formed with a contact window 39 through which an aluminum wiring layer 40 is contacted to the other of the source/drain regions 29. In this embodiment, a thick silicon oxide layer 41 is formed in the lightly doped layer 23 and series as an isolation region.

Description will be made for a fabrication process of the structure illustrated in FIG. 2 with reference to FIGS. 3A to 3G. The starting material is a p-type single crystal silicon substrate 51 which was formed by an epitaxial growing technique on a heavily doped p-type single crystal silicon layer, then the p-type single crystal silicon substrate 51 has a heavily doped layer 52 ( silicon body of single crystal ) with a boron atom concentration ranging between $5 \times 10^{18}$ cm$^{-3}$ and $5 \times 10^{19}$ cm$^{-3}$ and a lightly doped layer 53 with a boron atom concentration ranging between $1 \times 10^{15}$ cm$^{-3}$ and $1 \times 10^{16}$ cm$^{-3}$. In this instance, the lightly doped layer 53 has a thickness ranging between 2 microns and 4 microns. The lightly doped layer 53 was epitaxially grown on the heavily doped layer 52, so that a transition area 54 takes place due to difference in boron atom concentration and extends from the original upper surface of the heavily doped layer 52 into both of the heavily doped and lightly doped layers 52 and 53.

Figure 3A:
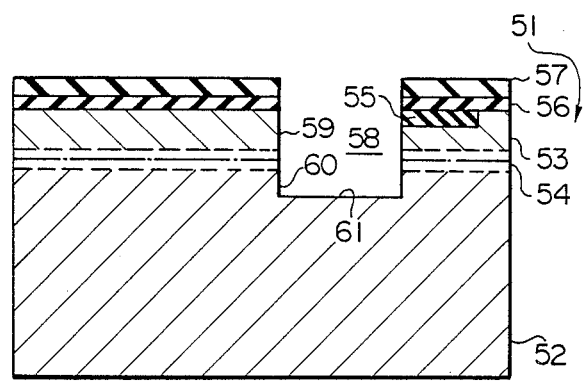
FIGS. 3A to 3G are cross sectional views showing a series of process steps for fabrication of the structure illustrated in FIG. 2.

First, an silicon oxide layer is thermally grown on the upper surface of the lightly doped layer 53, and, thereafter, a silicon nitride film is deposited on the silicon dioxide film by using a chemical vapor deposition technique. The silicon nitride film is partially removed. The remaining silicon nitride film is employed as a mask to form the thick field silicon dioxide layer 55 by thermal oxidation. A p+-type channel stopper region (not shown) may be formed under the silicon dioxide layer 55. After formation of the isolation region 55, the mask silicon nitride film is removed and a silicon dioxide film 56 is thermally grown to a thickness of about 500 angstroms on the upper surface of the lightly doped layer 53, and the thermal oxidation process is followed by a chemical vapor deposition to form a silicon nitride film 57 of about 3000 angstroms thick. Lithographic techniques and reactive etching techniques are repeated to form a cavity 58 which is defined by a side wall portion 59 of the lightly doped layer 53, a side wall portion 60 of the heavily doped layer 52 and a bottom wall portion 61 of the heavily doped layer 52, a side face of the isolation region 55 is exposed to the cavity 58. The resultant structure is illustrated in FIG. 3A.

Figure 3B:
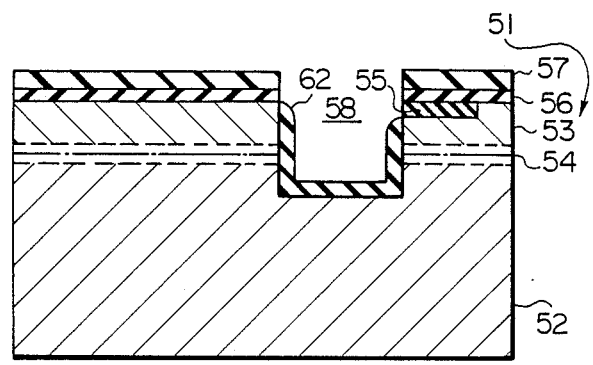
Figure 3C:
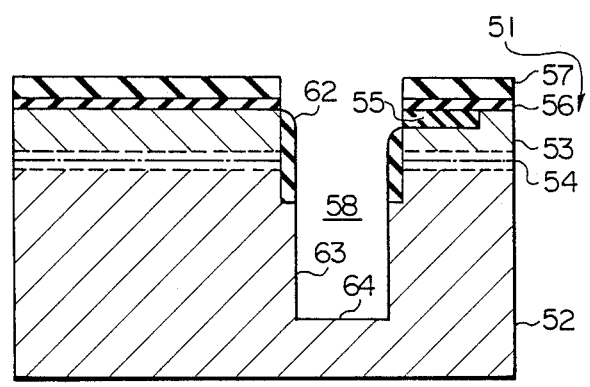

Next, a relatively thick dielectric film 62 is formed on the side wall portions 59 and 60 and the bottom wall portion 61 as will be seen from FIG. 3B of the drawings. In this fabrication process, the dielectric film 62 is thermally grown to a thickness ranging between 500 angstroms and 3000 angstroms on the side and bottom wall portions 59, 60 and 61, however a silicon dioxide film or a silicon nitride film may be deposited by using a chemical vapor deposition as the film 62.

The dielectric film 62 is anisotropically removed to expose the bottom wall portion 61 which in turn is removed to deepen the cavity 58, so that the dielectric film 62 is left on the side wall portions 59 and 60 and a deep side wall portion 63 and a bottom wall portion 64 are exposed to the deep cavity 58. As will be seen from FIG. 3C, the transition area 54 is fully covered with the dielectric material of the film 62. Boron atoms may be implanted into the deep side wall portion 63 and the bottom wall portion 64 of the single crystal heavily doped layer 52 to further increase the boron atom concentration by using the dielectric film 62 as a mask.

Figure 3D:
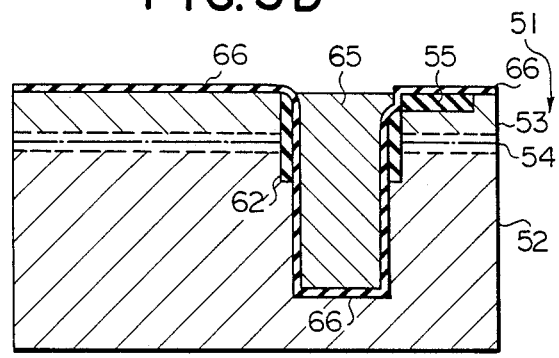

Formation of a storage electrode 65 follows. Firstly, the silicon dioxide film 56 and the silicon nitride film 57 is stripped off from the upper surface of the lightly doped layer 53, and a fresh thin silicon dioxide film 66 is formed on the entire surface of the silicon substrate 51, i.e., the upper surface of the lightly doped layer 53, the dielectric film 62, the side wall portion 63 and the bottom wall portion 64, and a trench is defined by the thin dielectric film 66. The trench is filled with a phosphorus doped polysilicon to form the storage electrode 65. Namely, a doped polysilicon is deposited on the entire surface of the structure, and an etch-back technique is applied to the deposited polysilicon. These polysilicon deposition and the etch-back technique are repeated to form the storage electrode 65 with an uniform upper surface as shown in FIG. 3D.

Figure 3E:
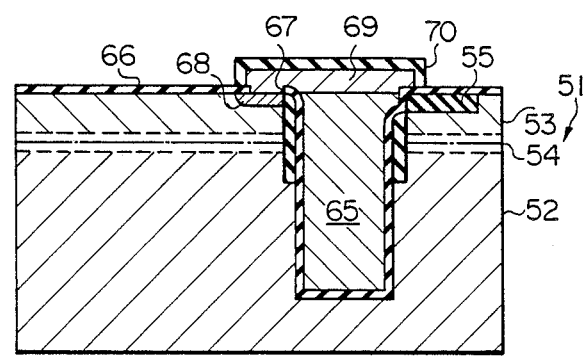

A contact window 67 is formed in the thin dielectric film 66 to expose a part of a source/drain forming area of the lightly doped layer 53, and, then, a polysilicon is deposited on the entire surface of the structure and is doped with phosphorus atoms. The polysilicon is contacted to the part of the source/drain forming area, so that the phosphorus atoms contained in the deposited polysilicon are diffused into the part of the source/drain forming area during the formation of the polysilicon layer, thereby forming a heavily doped n-type region 68. The polysilicon layer is etched and pattered by using the lithographic techniques and, thereafter, a reactive etching technique to form a bridging member 69 which covers the storage electrode 65 and the contact window 67. The resultant structure is located in an oxidation ambient to oxidize the surface portion of the bridging member 69, so that an isolating film 70 is formed on the entire surface of the bridging member 69 as shown in FIG. 3E. Thus, a trench-type storage capacitor 71 is formed in the silicon substrate 51.

The subsequent step is formation of a MOS type field effect transistor serving as a switching transistor 72 in the vicinity of the trench-type storage capacitor 71. However, the process of fabricating the MOS structure is well known in the art, so that no further description will be incorporated. A word line 73 is formed on the thin silicon dioxide film 66, and the word line 73 serves as a gate electrode of the switching transistor 72. One of the source/drain regions 74 of the switching transistor 72 should be contacted to the heavily doped n-type region 68, so that a bit of data information propagates the switching transistor 72 for writing-in or reading-out operation when an active signal is applied to the word line 73. In this instance, the word line 73 is formed of polysilicon, however a silicide or a combination of the polysilicon film and the silicide film may be alternatively used to form the word line 73. The resultant structure of this stage is illustrated in FIG. 3F.

Figure 3F:
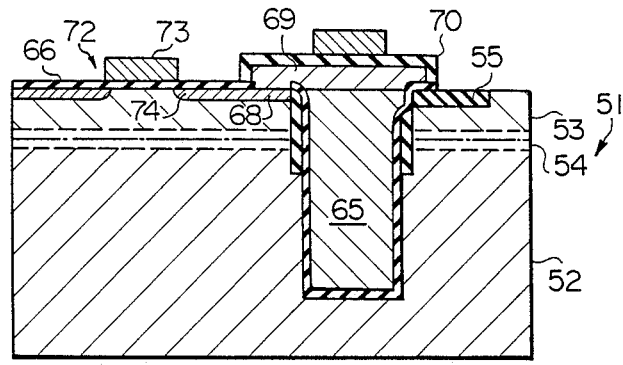
Figure 3G:
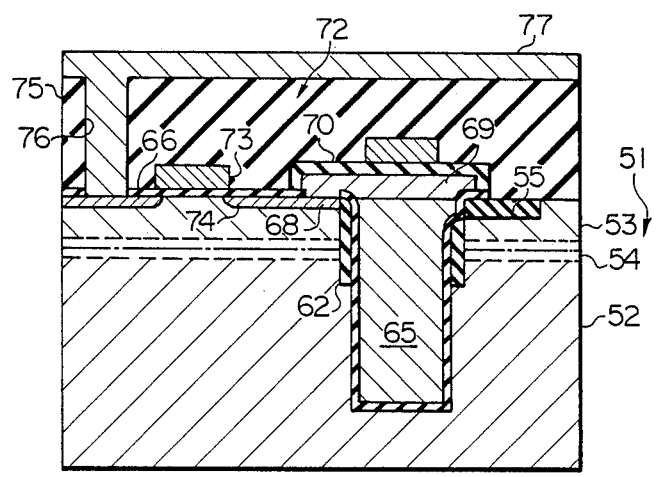

On the entire surface of the resultant structure illustrated in FIG. 3F is deposited an insulating material to form an insulative layer 75 which is formed with an contact opening 76. Aluminum is deposited on the entire surface of the insulative layer 75, and the aluminum film is etched and patterned to form a wiring layer 77 which contacts at one end thereof to the other of the source/drain regions of the switching transistor 72.

Figure 4A:
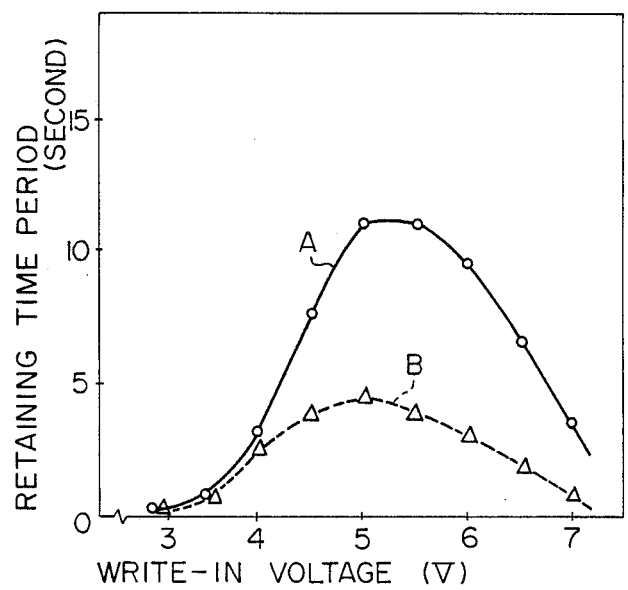
FIG. 4A is a graph showing the relationship between a data retaining time period and a write-in voltage.
Figure 4B:
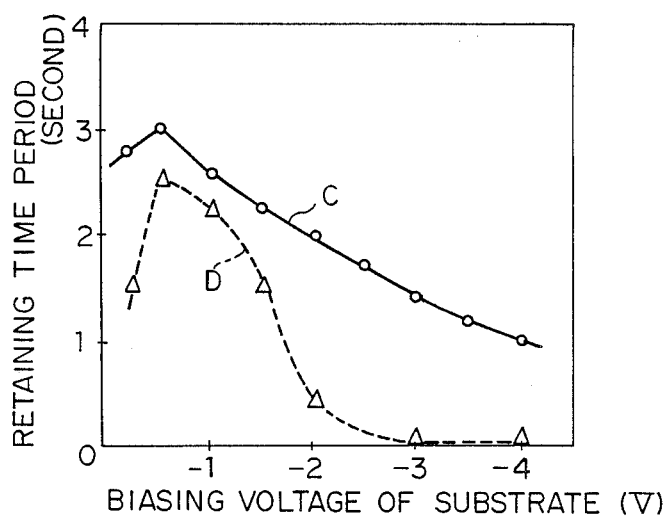
FIG. 4B is a graph showing the relationship between a data retaining time period and a biasing voltage to the substrate.

Turning to FIGS. 4A and 4B, the characteristics of the memory cell of the present invention are compared with those of the prior-art memory cell. In FIG. 4A, plots A shows a data retaining time period of the memory cell according to the present invention in terms of a write-in voltage. Namely, when the write-in voltage is supplied to the memory cell for a data bit during a write-in operation, the memory cell retains the data bit for the retaining time period without refreshing operation. As will be understood from comparing plots A with plots B showing a relationship between a write-in voltage and a data retaining time period for the prior-art memory cell, the data bit, plots A, can be retained for a longer time period in the memory cell according to the present invention. This is because of the fact that the leakage current is reduced by virtue of the dielectric film 62 covering the transition area 54. Plots C in FIG. 4B shows a relationship between a data retaining time period and a biasing voltage applied to the silicon substrate 51, and plots D shows the same relationship for the prior-art memory cell. In both cases, the data bit is written into the memory cell by application of write-in voltage of about 4 volts. Comparing plots C with plots D, it is understood that the memory cell according to the present invention is less sensitive to the biasing voltage to the silicon substrate.

Second Embodiment

Figure 5A:
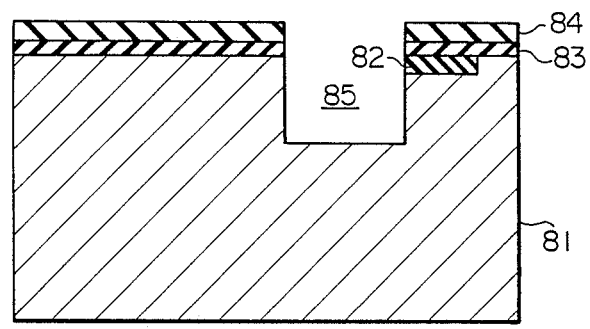
FIGS. 5A to 5G are cross sectional views showing a series of process steps for fabrication of another memory cell structure embodying the present invention.

Turning to FIGS. 5A to 5G, a series of structures are illustrated for description of a fabrication process through which another memory cell structure is formed. The process starts with a lightly doped silicon substrate 81 which has a boron atom concentration ranging between $1 \times 10^{15}$ cm$^{-3}$ and $1 \times 10^{16}$ cm$^{-3}$. First, an isolating region 82 of a thick field insulating layer is formed by a well known manner in a surface portion of the lightly doped silicon substrate 81, and a silicon dioxide film 83 and a silicon nitride film 84 are successively deposited to respective thicknesses of about 500 angstroms and 3000 angstroms on the entire surface of the lightly doped silicon substrate 81. Appropriate reactive etching techniques are applied to the resultant structure to partially remove the silicon nitride film 84, the silicon dioxide film 83 and the lightly doped silicon substrate 81, so that a cavity 85 is formed therein as shown in FIG. 5A. In this instance, the cavity has a depth ranging between 1 micron to 3 microns, but the cavity may have a different depth in another example.

Figure 5B:
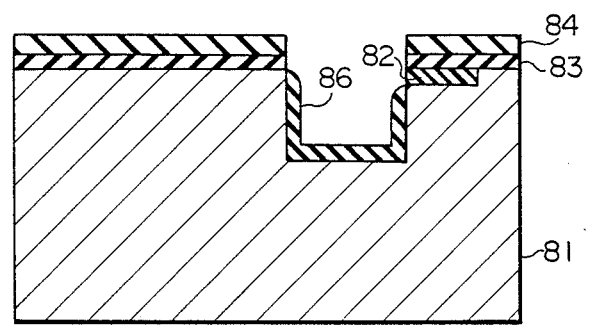
Figure 5C:
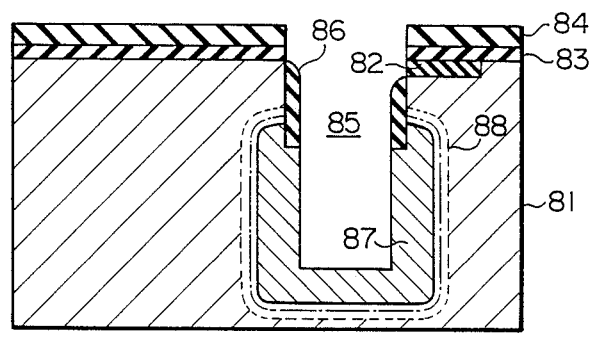

A thick insulative film 86 is formed on the side and bottom wall portions defining the cavity 85 by using a thermal oxidation technique, otherwise the insulative film 86 may be formed of silicon nitride or silicon dioxide deposited by using a chemical vapor deposition in another example. The thickness of the insulative film 86 ranges between 500 angstroms and 3000 angstroms. The resultant structure is illustrated in FIG. 5B.

Anisotropic reactive ion etching techniques are applied to the insulative material 86 on the bottom wall in the cavity 85 and the lightly doped silicon substrate 81 under the bottom wall is removed. Succeedingly, a reactive etching technique is applied to deepen the cavity 85, and the deep side wall portion and the deep bottom portion are exposed to this deep cavity, leaving the insulative film 86 on the side wall of the lightly doped silicon substrate 81. Boron atoms are diffused into the lightly doped silicon substrate 81 using the insulative layer 86, the silicon nitride film 84 and the silicon dioxide film 83 as masks, so that a heavily doped p-type region 87 is formed in the wall of the cavity 85 of the lightly doped silicon substrate 81. Then, the silicon substrate 81 is placed in a high temperature ambient, so that boron atoms are driven into the lightly doped silicon substrate 81 until a transition area 88 takes place between the lightly doped silicon substrate 81 and the heavily doped p-type region 87 as will be seen from FIG. 5C. The transition area 88 terminates at the thick insulative film 86.

Figure 5D:
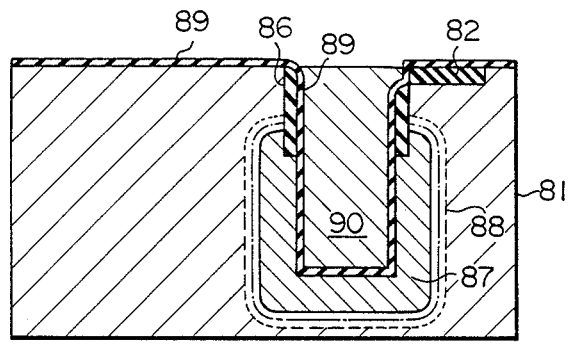

The silicon nitride film 84 and the silicon dioxide film 83 are stripped off to expose a surface of the silicon substrate 81, then the silicon substrate is placed in an oxidation ambient to form a thin dielectric film 89 which defines a trench, and the trench is filled with a conductive material such as, for example, a polysilicon doped with phosphorus atoms by repeating the deposition of polysilicon and the etch-back technique. The conductive material serves as a storage electrode 90, and the resultant structure is illustrated in FIG. 5D.

Figure 5E:
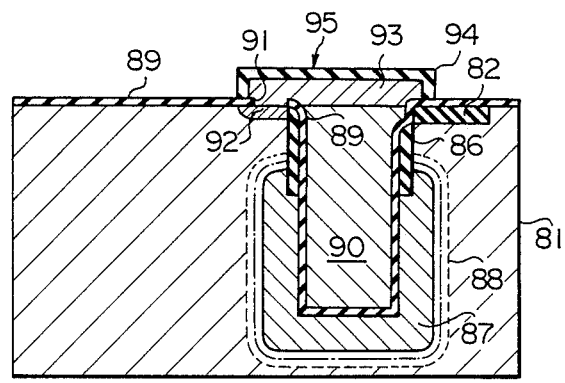

A contact window 91 is formed in the thin dielectric film 86 to expose a part of a source/drain forming area of the lightly doped silicon substrate 81, and, then, a polysilicon is deposited on the entire surface of the structure and is doped with phosphorus atoms. The polysilicon is contacted to the part of the source/drain forming area, so that the phosphorus atoms contained in the deposited polysilicon are diffused into the part of the source/drain forming area during the formation of the polysilicon layer, thereby forming a heavily doped n-type region 92. The polysilicon layer is etched and pattered by using the lithographic techniques and, thereafter, a reactive etching technique to form a bridging member 93 which covers the storage electrode 90 and the contact window 91. The resultant structure is located in an oxidation ambient to oxidize the surface portion of the bridging member 93, so that an isolating film 94 is formed on the entire surface of the bridging member 93 as shown in FIG. 5E. Thus, a trench-type storage capacitor 95 is formed in the silicon substrate 81.

The subsequent step is formation of a MOS type field effect transistor serving as a switching transistor 96 in the vicinity of the trench-type storage capacitor 95. However, the process of fabricating the MOS structure is well known in the art, so that no further description will be incorporated. A word line 97 is formed on the thin silicon dioxide film 89, and the word line 97 serves as a gate electrode of the switching transistor 96. One of the source/drain regions 98 of the switching transistor 96 should be contacted to the heavily doped n-type region 92, so that a bit of data information propagates the switching transistor 96 for writing-in or reading-out operation when an active signal is applied to the word line 97. In this instance, the word line 97 is formed of polysilicon, however a silicide or a combination of the polysilicon film and the silicide film may be alternatively used to form the word line 97. The resultant structure of this stage is illustrated in FIG. 5F.

Figure 5F:
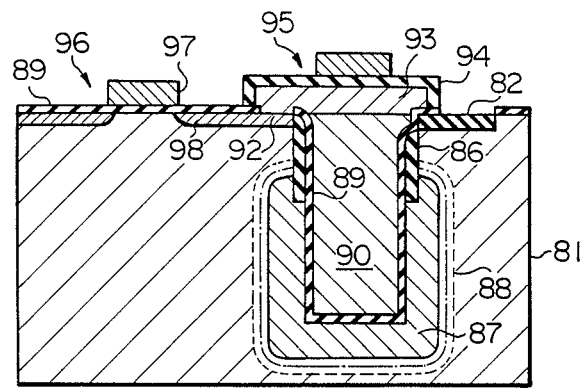
Figure 5G:
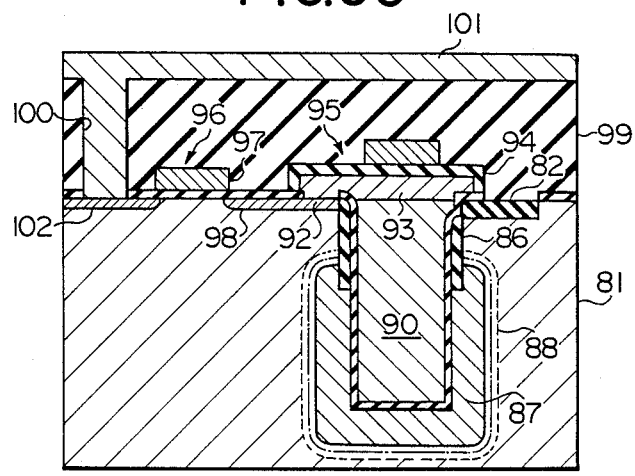

On the entire surface of the resultant structure illustrated in FIG. 5F is deposited an insulating material to form an insulative layer 99 which is formed with an contact opening 100. Aluminum is deposited on the entire surface of the insulative layer 99, and the aluminum film is etched and patterned to form a wiring layer 101 which contacts at one end thereof to the other of the source/drain regions of the switching transistor 102.

In the above mentioned embodiments, the switching transistors 72 and 96 are formed in the surface portions of the silicon substrates 51 and 81, respectively, however the switching transistor may be formed in the trench in another implementation.

Although particular embodiment of the present invention have been shown and described, it will be obvious to those skilled in the art that various changes and modifications may be made without departing from the spirit and scope of the present invention.

What is claimed is:

1. A semiconductor memory cell comprising a switching transistor and a storage capacitor fabricated in a multiple level semiconductor substrate structure having a heavily doped substrate layer and a lightly doped epitaxial layer grown on an upper surface of the heavily doped substrate layer, a transition layer graded in impurity atom concentration being produced between said heavily doped substrate layer and said lightly doped epitaxial layer, said storage capacitor comprising:

(a) a first electrode formed by a first side wall portion of said lightly doped epitaxial layer, a second side wall portion of said heavily doped substrate layer and a bottom wall portion of the heavily doped substrate layer, said first and second side wall portions and said bottom wall portion defining a cavity, (b) a dielectric film formed on said first and second side wall portions and said bottom wall portion and defining a trench, and (c) a second electrode formed in said trench and contacting said dielectric film, wherein said dielectric film has a relatively thin portion, and a relatively thick portion wherein said relatively thick portion covers a part of said lightly doped epitaxial layer, said transition layer and a part of said heavily doped substrate layer, said part of said doped epitaxial layer being contiguous to said transition layer on one side thereof, said part of said heavily doped substrate layer being contiguous to said transition layer on the other side thereof.

2. A semiconductor memory cell as set forth in claim 1, in which said relatively thin portion is formed by a first insulative film and said relatively thick portion is formed by said first insulative film and a second insulative film formed on said first insulative film.

3. A semiconductor memory cell as set forth in claim 2, in which said first and second insulative films are formed of silicon dioxide.

4. A semiconductor memory cell as set forth in claim 3, in which said second insulative film has a thickness ranging between 500 angstroms and 3000 angstroms.

5. A semiconductor memory cell as set forth in claim 4, in which said heavily doped substrate layer has a boron atom concentration ranging between $5 \times 10^{18}$ cm$^{-3}$ and $5 \times 10^{19}$ cm$^{-3}$.

6. A semiconductor memory cell as set forth in claim 5, in which said lightly doped epitaxial layer has a boron atom concentration ranging between $1 \times 10^{15}$ cm$^{-3}$ and $1 \times 10^{16}$ cm$^{-3}$.

7. A semiconductor memory cell as set forth in claim 1, in which said switching transistor is of a MOS type field effect transistor.

8. A semiconductor memory cell as set forth in claim 7, in which said MOS type field effect transistor has two heavily doped impurity regions opposite in conductivity type to said semiconductor substrate structure.

9. A semiconductor memory cell as set forth in claim 8, in which said semiconductor memory cell further comprises a conductive layer electrically interconnecting one of said heavily doped impurity regions and said second electrode.

10. A semiconductor memory cell comprising a switching transistor and a storage capacitor fabricated in a multiple level semiconductor substrate structure having a heavily doped substrate layer and a lightly doped epitaxial layer grown on an upper surface of the heavily doped layer, a transition layer graded in impurity atom concentration being produced between said heavily doped substrate layer and said lightly doped epitaxial layer, said storage capacitor comprising:
(a) a first electrode formed by a first side wall portion of said lightly doped epitaxial layer, a second side wall portion of said heavily doped substrate layer and a bottom wall portion of the heavily doped substrate layer, said first and second side wall portions and said bottom wall portion defining a cavity,
(b) a dielectric film formed on said first and second side wall portions and said bottom wall portion and defining a trench,
(c) a second electrode formed in said trench and contacting said dielectric film, and
(d) an isolating region partially formed in said first side wall portion and identical in conductivity type with the first side wall portion, wherein said dielectric film has a relatively thin portion and a relatively thick portion wherein said relatively thick portion which covers a part of said lightly doped epitaxial layer, said transition layer and a part of said heavily doped substrate layer, said part of said lightly doped epitaxial layer being contiguous to said transition layer on one side thereof, said part of said heavily doped substrate layer being contiguous to said transition layer on the other side thereof.

* * * * *